United States Patent
Seong et al.

(10) Patent No.: US 12,200,968 B2
(45) Date of Patent: Jan. 14, 2025

(54) DISPLAY DEVICE

(71) Applicant: SAMSUNG DISPLAY CO., LTD., Yongin-si (KR)

(72) Inventors: Jaemin Seong, Suwon-si (KR); Inok Kim, Osan-si (KR); Yousik Shin, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 666 days.

(21) Appl. No.: 17/323,145

(22) Filed: May 18, 2021

(65) Prior Publication Data

US 2022/0052300 A1    Feb. 17, 2022

(30) Foreign Application Priority Data

Aug. 12, 2020  (KR) .......................... 10-2020-0101199

(51) Int. Cl.
*H10K 50/86*     (2023.01)
*H10K 59/12*     (2023.01)
*H10K 59/38*     (2023.01)

(52) U.S. Cl.
CPC ............. *H10K 50/86* (2023.02); *H10K 59/38* (2023.02); *H10K 59/12* (2023.02)

(58) Field of Classification Search
CPC ...... H10K 50/86; H10K 59/38; H10K 59/122; H10K 59/12; G02B 1/115; G02F 1/133614

See application file for complete search history.

(56) References Cited

U.S. PATENT DOCUMENTS

| 2015/0276175 | A1  | 10/2015 | Moriya et al. |
| 2017/0263657 | A1* | 9/2017  | Chu ............... H01L 27/14685 |
| 2017/0263867 | A1  | 9/2017  | Chu et al. |
| 2019/0179065 | A1* | 6/2019  | Kim ..................... G02B 5/201 |

FOREIGN PATENT DOCUMENTS

| KR | 10-2017-0014755 | 7/2015 |
| KR | 10-2019-0033816 | 9/2017 |
| KR | 10-2020-0041044 | 10/2018 |

OTHER PUBLICATIONS

Extended European Search Report Dated Jan. 27, 2022 For European Patent Application No. 21189391.2.

* cited by examiner

*Primary Examiner* — Angela M. Medich
(74) *Attorney, Agent, or Firm* — F. CHAU & ASSOCIATES, LLC

(57) ABSTRACT

A display device includes a light emitting device on a substrate in each of first to third pixel areas, a color conversion layer that includes a first color conversion pattern, a second color conversion pattern and a light transmission pattern on the light emitting device, a color filter layer that includes a first color filter, a second color filter and a third color filter, and a low reflection layer that includes a first low reflection pattern with a plurality of first inorganic layers on the first color filter, a second low reflection pattern with a plurality of second inorganic layers on the second color filter, and a third low reflection pattern with a plurality of third inorganic layers on the third color filter, and a number of at least two of first inorganic layers, second inorganic layers, and third inorganic layers differ from each other.

18 Claims, 6 Drawing Sheets

DISPLAY DEVICE

CROSS-REFERENCE TO RELATED APPLICATION

This application claims priority under 35 USC § 119 from Korean Patent Application No. 10-2020-0101199, filed on Aug. 12, 2020 in the Korean Intellectual Property Office (KIPO), the contents of which are herein incorporated by reference in their entirety.

1. TECHNICAL FIELD

Embodiments are directed to a display device. More particularly, embodiments are directed to a display device that includes a color conversion layer.

2. DISCUSSION OF THE RELATED ART

The market for display devices that connect users and information is growing as information technology develops. Accordingly, the use of flat panel displays such as organic light emitting displays and liquid crystal displays is increasing.

Recently, a display device that includes a color conversion layer and a color filter layer has been proposed to implement a display device that has excellent color gamut and high luminance. However, when external light is incident to a color filter layer and is reflected between the color filter layer and a capping layer or overcoat layer on the color filter layer, a user may visually see the reflected external light, and accordingly, the display quality of the display device deteriorates.

SUMMARY

Embodiments provide a display device that has an improved display quality.

A display device according to an embodiment includes a first pixel area, a second pixel area, a third pixel area, and a non-pixel area positioned between the first to third pixel areas, a first substrate, a light emitting device disposed on the first substrate in each of the first to third pixel areas, a color conversion layer that includes a first color conversion pattern, a second color conversion pattern, and a light transmission pattern disposed on the light emitting device in the first pixel area, the second pixel area, and the third pixel area, respectively, a color filter layer that includes a first color filter, a second color filter, and a third color filter disposed on the first color conversion pattern, the second color conversion pattern, and the light transmission pattern, respectively, and a low reflection layer that includes a first low reflection pattern disposed on the first color filter and that includes a plurality of first inorganic layers, a second low reflection pattern disposed on the second color filter and that includes a plurality of second inorganic layers, and a third low reflection pattern disposed on the third color filter and that includes a plurality of third inorganic layers. A number of at least two of the first inorganic layers, second inorganic layers, and third inorganic layers differ from each other.

In an embodiment, each of the first low reflection pattern, the second low reflection pattern, and the third low reflection pattern may include at least two of a silicon nitride layer, a silicon oxide layer, and a silicon oxynitride layer.

In an embodiment, the third color filter may include a blue color filter.

In an embodiment, a number of third inorganic layers may be two.

In an embodiment, the third low reflection pattern may include a silicon nitride layer and a silicon oxide layer disposed on the silicon nitride layer.

In an embodiment, a number of the third inorganic layers may be three.

In an embodiment, the third low reflection pattern may include a first silicon oxide layer, a silicon nitride layer disposed on the first silicon oxide layer, and a second silicon oxide layer disposed on the silicon nitride layer.

In an embodiment, the third low reflection pattern may include a silicon oxide layer, a silicon nitride layer disposed on the silicon oxide layer, and a silicon oxynitride layer disposed on the silicon nitride layer.

In an embodiment, the third low reflection pattern may include a silicon oxynitride layer, a silicon nitride layer disposed on the silicon oxynitride layer, and a silicon oxide layer disposed on the silicon nitride layer.

In an embodiment, a number of the third inorganic layers may be four.

In an embodiment, the third low reflection pattern may include a first silicon oxide layer, a silicon oxynitride layer disposed on the first silicon oxide layer, a silicon nitride layer disposed on the silicon oxynitride layer, and a second silicon oxide layer disposed on the silicon nitride layer.

In an embodiment, the third low reflection pattern may include a silicon oxynitride layer, a first silicon oxide layer disposed on the silicon oxynitride layer, a silicon nitride layer disposed on the first silicon oxide layer, and a second silicon oxide layer disposed on the silicon nitride layer.

In an embodiment, the display device may further include a light blocking layer disposed in the non-pixel area between the color conversion layer and the low reflection layer, and that includes a same material as that of the third color filter.

In one embodiment, the third low reflection pattern may overlap the light blocking layer.

In one embodiment, the display device may further include an overcoat layer disposed between the color filter layer and the low reflection layer.

In one embodiment, the display device may further include a hard coating layer disposed on the low reflection layer.

In one embodiment, the display device may further include a second substrate disposed between the color filter layer and the low reflection layer and a filling layer disposed between the light emitting device and the color conversion layer.

In one embodiment, each thickness of the first inorganic layers, the second inorganic layers, and the third inorganic layers may be about 3000 Å or less.

A display device according to an embodiment includes a first pixel area, a second pixel area, a third pixel area, and a non-pixel area positioned between the first to third pixel areas, a first substrate, a light emitting device disposed on the first substrate in each of the first to third pixel areas, a color conversion layer that includes a first color conversion pattern, a second color conversion pattern, and a light transmission pattern disposed on the light emitting device in the first pixel area, the second pixel area, and the third pixel area, respectively, a color filter layer that includes a first color filter, a second color filter, and a third color filter disposed on the first color conversion pattern, the second color conversion pattern, and the light transmission pattern, respectively, and a low reflection layer that includes a first low reflection pattern disposed on the first color filter and that includes a plurality of first inorganic layers, a second low reflection pattern disposed on the second color filter and that includes a plurality of second inorganic layers, and a third low reflection pattern disposed on the third color filter and that includes a plurality of third inorganic layers. A number of first inorganic layers, a number of second inorganic layers, and a number of third inorganic layers may be equal to each other, and at least two of the first inorganic layers, the second inorganic layers, and the third inorganic layers may have different types from each other.

A display device according to an embodiment includes a first pixel area, a second pixel area, a third pixel area, and a non-pixel area positioned between the first to third pixel areas, a first substrate, a light emitting device disposed on the first substrate in each of the first to third pixel areas, a color conversion layer that includes a first color conversion pattern, a second color conversion pattern, and a light transmission pattern disposed on the light emitting device in the first pixel area, the second pixel area, and the third pixel area, respectively, a color filter layer that includes a first color filter, a second color filter, and a third color filter disposed on the first color conversion pattern, the second color conversion pattern, and the light transmission pattern, respectively, and a low reflection layer that includes a first low reflection pattern disposed on the first color filter and that includes a plurality of first inorganic layers, a second low reflection pattern disposed on the second color filter and that includes a plurality of second inorganic layers, and a third low reflection pattern disposed on the third color filter and that includes a plurality of third inorganic layers. A number of first inorganic layers, a number of second inorganic layers, and a number of third inorganic layers may be equal to each other, and types of the first inorganic layers, types of the second inorganic layers, and types of the third inorganic layers may be the same as each other. A lamination sequence of the first inorganic layers, a lamination sequence of the second inorganic layers, and a lamination sequence of the third inorganic layers may differ from each other.

A display device according to an embodiment includes a light emitting device disposed in each of a first, a second, and a third pixel area; a color conversion layer that includes a first color conversion pattern, a second color conversion pattern, and a light transmission pattern disposed on the light emitting device in the first pixel area, the second pixel area, and the third pixel area, respectively; a color filter layer that includes a first color filter, a second color filter, and a third color filter disposed on the first color conversion pattern, the second color conversion pattern, and the light transmission pattern, respectively; and a low reflection layer that includes a first low reflection pattern disposed on the first color, a second low reflection pattern disposed on the second color filter, and a third low reflection pattern disposed on the third color filter, wherein each of the first low reflection pattern, the second low reflection pattern, and the third low reflection pattern includes at least two of a silicon nitride layer, a silicon oxide layer, and a silicon oxynitride layer.

A display device according to embodiments includes a first low reflection pattern, a second low reflection pattern, and a third low reflection pattern disposed on a first color filter, a second color filter, and a third color filter, respectively, and the first low reflection pattern, the second low reflection pattern, and the third low reflection pattern may include different numbers of inorganic layers from each other, having different types from each other, or having different lamination sequences from each other. Accordingly, external light reflection of a display device may decrease, and display quality of a display device may be improved.

DETAILED DESCRIPTION OF THE EMBODIMENTS

Hereinafter, display devices in accordance with embodiments will be described in detail with reference to the accompanying drawings.

Herein, when one value is described as being about equal to another value, e.g. "a thickness of the layer is about 3000 Å or less", it is to be understood that the values are equal to each other to within a measurement error, or if measureably unequal, are close enough in value to be functionally equal to each other as would be understood by a person having ordinary skill in the art.

Figure 1:
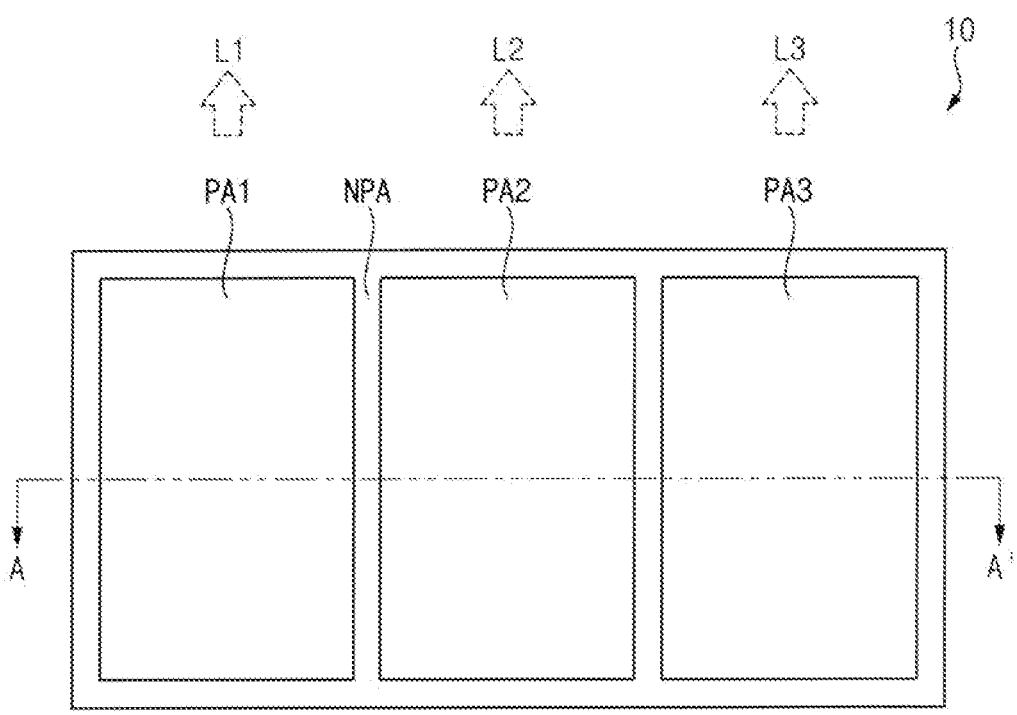
FIG. 1 is a plan view of a display device according to an embodiment of the present disclosure.

FIG. 1 is a plan view of the display device according to an embodiment of the present disclosure.

Referring to FIG. 1, a display device 10 according to an embodiment includes a first pixel area PA1, a second pixel area PA2, a third pixel area PA3, and a non-pixel area NPA.

In an embodiment, the first pixel area PA1 emits first color light L1, the second pixel area PA2 emits second color light L2, and the third pixel area PA3 emits third color light L3. In an embodiment, the first color is red, the second color is green, and the third color is blue. The first pixel area PA1 is a red pixel area, the second pixel area PA2 is a green pixel area, and the third pixel area PA3 is a blue pixel area.

In an embodiment, the first pixel area PA1, the second pixel area PA2, and the third pixel area PA3 form one pixel area. The pixel area emits light by mixing the first light L1, second light L2, and third light L3.

In an embodiment, the non-pixel area is positioned between the first pixel area PA1, the second pixel area PA2, and the third pixel area PA3. For example, the non-pixel area surrounds the first pixel area PA1, the second pixel area PA2, and the third pixel area PA3 when viewed in a plan view. The non-pixel area does not emit light.

Figure 2:
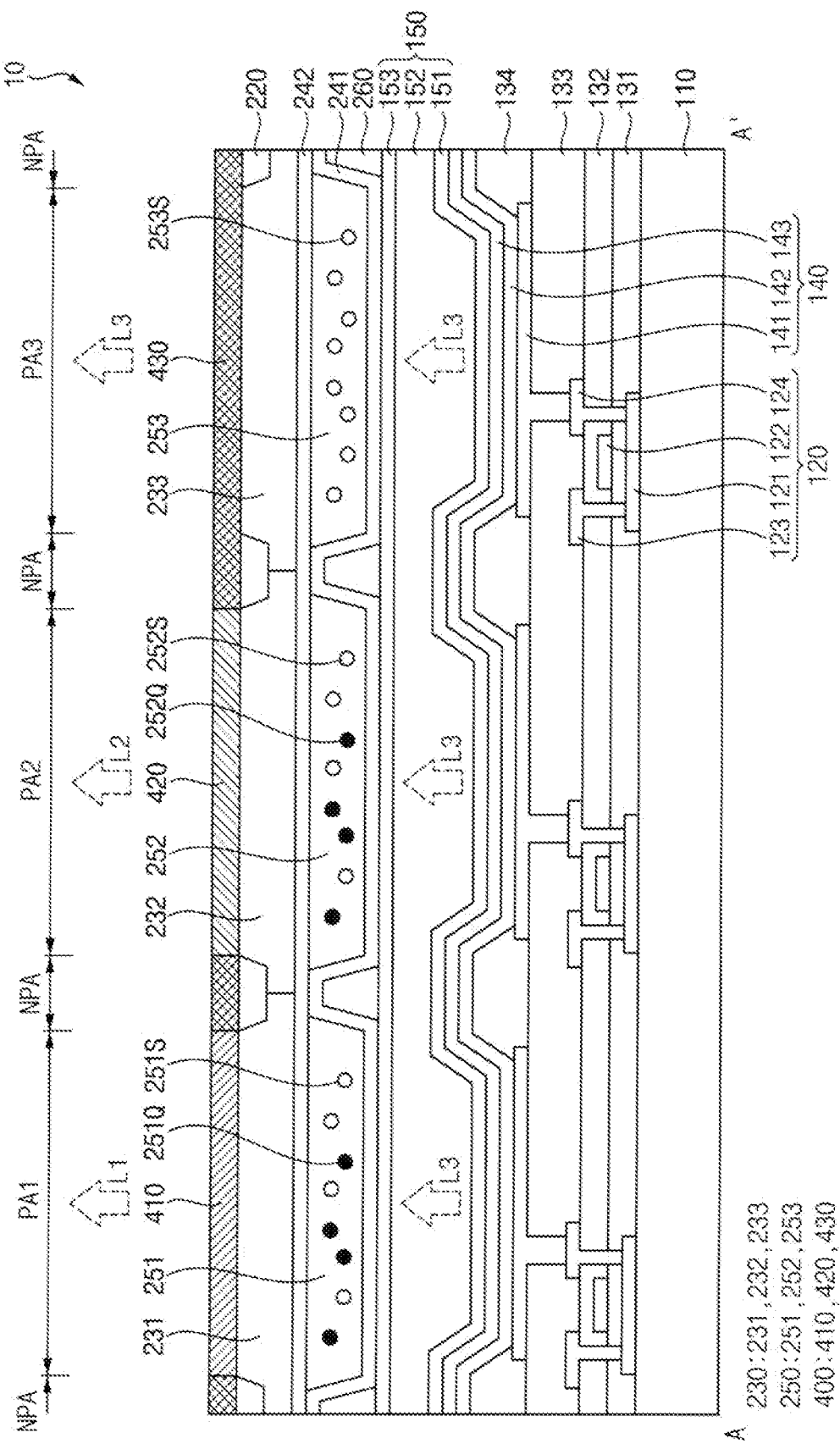
FIG. 2 is a sectional view taken along line A-A' of FIG. 1.

FIG. 2 is a sectional view taken along line A-A' of FIG. 1.

Referring to FIG. 2, in an embodiment, the display device 10 includes a first substrate 110, a transistor 120, a light emitting device 140, a thin film encapsulation layer 150, a bank layer 260, a color conversion layer 250, a color filter layer 230, a light blocking layer 220, and a low reflection layer 400.

The first substrate 110 may be a transparent or opaque insulating substrate. In an embodiment, the first substrate 110 may include glass or quartz, etc. In an embodiment, the first substrate 110 include an organic insulating material such as polyimide, polycarbonate, polyethylene terephthalate, or polyacrylate.

An active pattern 121 is disposed on the first substrate 110. In an embodiment, the active pattern 121 may include amorphous silicon or polycrystalline silicon, etc. In an embodiment, the active pattern 121 includes an oxide semiconductor.

In an embodiment, a gate insulating layer 131 is disposed on the first substrate 110, and covers the active pattern 121. The gate insulating layer 131 includes an inorganic insulating material such as silicon oxide, silicon nitride, or silicon oxynitride.

In an embodiment, a gate electrode 122 is disposed on the gate insulating layer 131, and overlap the active pattern 121. The gate electrode 122 includes a conductive material such as copper (Cu), molybdenum (Mo), titanium (Ti), or aluminum (Al).

In an embodiment, an interlayer insulating layer 132 is disposed on the gate insulating layer 131, and covers the gate electrode 122. The interlayer insulating layer 132 includes an inorganic insulating material such as silicon oxide, silicon nitride, or silicon oxynitride.

In an embodiment, a source electrode 123 and a drain electrode 124 are disposed on the interlayer insulating layer 132, and connected to the active pattern 121. The source electrode 123 and the drain electrode 124 include a conductive material such as copper (Cu), molybdenum (Mo), titanium (Ti), or aluminum (Al).

The active pattern 121, the gate electrode 122, the source electrode 123, and the drain electrode 124 form the transistor 120. The transistor 120 is disposed in each of the first pixel area PA1, the second pixel area PA2, and the third pixel area PA3.

In an embodiment, a planarization layer 133 is disposed on the interlayer insulating layer 132, and covers the source electrode 123 and the drain electrode 124. The planarization layer 133 may include an inorganic insulating material such as silicon oxide, silicon nitride, or silicon oxynitride, or an organic insulating material such as acryl-based resin, epoxy-based resin, phenol-based resin, polyamide-based resin, polyimide-based resin, unsaturated polyester-based resin, polyphenylene-based resin, polyphenylene-based sulfide resin, or benzocyclobutene.

In an embodiment, a pixel electrode 141 is disposed on the planarization layer 133, and connected to the drain electrode 124. The pixel electrode 141 includes a transparent conductive layer that includes one or more of indium-tin-oxide (ITO), indium-zinc-oxide (IZO), zinc oxide (ZnO), or indium oxide (In2O3), etc., and a reflective conductive layer that includes one or more of silver (Ag), magnesium (Mg), aluminum (Al), platinum (Pt), lead (Pb), gold (Au), nickel (Ni), neodymium (Nd), iridium (Ir), chromium (Cr), lithium (Li), or calcium (Ca), etc. In an embodiment, the pixel electrode 141 has a laminated structure of ITO, Ag, and ITO. The pixel electrode 141 is a reflective electrode.

In an embodiment, a pixel defining layer 134 is disposed on the planarization layer 133, and covers at least a part of the pixel electrode 141. In an embodiment, the pixel defining layer 134 covers a periphery of the pixel electrode 141, and exposes a pixel opening in a central portion of the pixel electrode 141. The pixel defining layer separates pixel electrode in the first pixel area PA1, the second pixel area PA2 and the third pixel area PA3 from each other. The pixel defining layer 134 may include an inorganic insulating material such as silicon oxide, silicon nitride, or silicon oxynitride, or an organic insulating material such as acryl-based resin, epoxy-based resin, phenol-based resin, polyamide-based resin, polyimide-based resin, unsaturated polyester-based resin, polyphenylene-based resin, polyphenylene-based sulfide resin, or benzocyclobutene.

In an embodiment, a light emitting layer 142 is disposed on the pixel electrode 141 exposed by the pixel opening and the pixel defining layer 134. In an embodiment, the light emitting layer 142 is a single layer that extends across the first pixel area PA1, the second pixel area PA2, the third pixel area PA3 and the non-pixel area NPA. Holes provided from the pixel electrode 141 and electrons provided from a counter electrode 143 combine in the light emitting layer 142 to form excitons, and the light emitting layer 142 emits light when the excitons decay from an excited state to a ground state. In an embodiment, the light emitting layer 142 emits the third light L3.

In an embodiment, a counter electrode 143 is disposed on the light emitting layer 142. The counter electrode 143 includes a transparent conductive layer that includes one or more of Lithium (Li), calcium (Ca), aluminum (Al), magnesium (Mg), silver (Ag), platinum (Pt), lead (Pb), nickel (Ni), gold (Au), neodymium (Nd), iridium (Ir), chromium (Cr), or barium (Ba), etc. The counter electrode 143 is a transmission electrode.

The pixel electrode 141, the light emitting layer 142, and the counter electrode 143 form the light emitting device 140. The light emitting device 140 is disposed in each of the first pixel area PA1, the second pixel area PA2, and the third pixel area PA3.

In an embodiment, the thin film encapsulation layer 150 is disposed on the counter electrode 143. The thin film encapsulation layer 150 can prevent impurities, moisture, etc., from permeating into the light emitting element 140. The thin film encapsulation layer 150 includes at least one inorganic encapsulation layer and at least one organic encapsulation layer. In an embodiment, the thin film encapsulation layer 150 includes a first inorganic encapsulation layer 151, a second inorganic encapsulation layer 153 disposed on the first inorganic encapsulation layer 151, and an organic encapsulation layer 152 disposed between the first inorganic encapsulation layer 151 and the second inorganic encapsulation layer 153.

In an embodiment, the bank layer 260 is disposed on the thin film encapsulation layer 150. The bank layer 260 is disposed in the non-pixel area NPA. The bank layer 260 blocks light incident to the bank layer 260. Accordingly, the bank layer 260 prevents color mixing between the first pixel area PA1, the second pixel area PA2, and the third pixel area PA3.

In an embodiment, a first protective layer 241 is disposed on the thin film encapsulation layer 150, and covers the bank layer 260. The first protective layer 241 can prevent impurities such as moisture and air from penetrating into the color filter layer 230 and the color conversion layer 250. The first protective layer 241 includes an inorganic insulating material such as silicon oxide, silicon nitride, or silicon oxynitride.

In an embodiment, the color conversion layer 250 is disposed on the first protective layer 241. The color conversion layer 250 includes a first color conversion pattern 251, a second color conversion pattern 252, and a light transmission pattern 253. The first color conversion pattern 251 is disposed in the first pixel area PA1, the second color conversion pattern 252 is disposed in the second pixel area PA2, and the light transmission pattern 253 is disposed in the third pixel area PA3. In one embodiment, the bank layer 260 may be disposed between the first color conversion pattern 251, the second color conversion pattern 252, and the light transmission pattern 253.

In an embodiment, the first color conversion pattern 251 converts light incident to the first color conversion pattern 251 into the first light L1. In an embodiment, the first color conversion pattern 251 converts the third light L3 into the first light L1. The first color conversion pattern 251 includes a red phosphor. The red phosphor includes at least one of (Ca, Sr, Ba)S, (Ca, Sr, Ba)$_2$Si$_5$N$_8$, (CaAlSiN$_3$), CaMoO$_4$, or Eu$_2$Si$_5$N$_8$. In addition, the first color conversion pattern 251 include quantum dots 251Q. The quantum dots 251Q convert the third light L3 into the first light L1. The first color conversion pattern 251 further includes scattering bodies 251S. The scattering bodies 251S scatter light incident to the first color conversion pattern 251 in various directions. The scattering bodies 251S may be metal oxide particles or organic particles. The metal oxide particles include titanium oxide (TiO$_2$), zirconium oxide (ZrO$_2$), aluminum oxide (Al$_2$O$_3$), indium oxide (In$_2$O$_3$), zinc oxide (ZnO), or tin oxide (SnO$_2$), etc., and the organic particles include acryl-based resin or urethane-based resin, etc.

In an embodiment, the second color conversion pattern 252 convert light incident to the second color conversion pattern 252 into the second light L2. In an embodiment, the second color conversion pattern 252 convert the third light L3 into the second light L2. The second color conversion pattern 252 include a green phosphor. The green phosphor includes at least one of yttrium aluminum garnet (YAG), (Ca, Sr, Ba)$_2$SiO$_4$, SrGa$_2$S$_4$, barium magnesium aluminate (BAM), alpha sialon (α-SiAlON), beta sialon (β-SiAlON), Ca$_3$Sc$_2$Si$_3$O$_{12}$, Tb$_3$Ab$_5$O$_{12}$, BaSiO$_4$, CaAlSiON, and (Sr$_{1-x}$Ba$_x$)Si$_2$O$_2$N$_2$. The x of (Sr$_{1-x}$Ba$_x$)Si$_2$O$_2$N$_2$ may be any number between 0 and 1. In addition, the second color conversion pattern 252 includes quantum dots 252Q. The quantum dots 252Q convert the third light L3 into the second light L2. The second color conversion pattern 252 further includes scattering bodies 252S. The scattering bodies 252S scatter light incident to the second color conversion pattern 252 in various directions. The scattering bodies 252S in the second color conversion pattern 252 are substantially the same as the scattering bodies 251S in the first color conversion pattern 251.

In an embodiment, the light transmission pattern 253 converts light incident to the light transmission pattern 253 into the third light L3. In an embodiment, the light transmission pattern 253 transmits the third light L3. The light transmission pattern 253 includes a transparent polymer material. In addition, the light transmission pattern 253 includes scattering bodies 253S. The scattering bodies 253S scatter light incident to the light transmission pattern 253 in various directions. The scattering bodies 253S in the light transmission pattern 253 are substantially the same as the scattering bodies 251S in the first color conversion pattern 251 and the scattering bodies 252S in the second color conversion pattern 252.

In an embodiment, a second protective layer 242 is disposed on the color conversion layer 250. The second protective layer 242 prevents impurities such as moisture and air from penetrating to the color filter layer 230 and the color conversion layer 250. The second protective layer 242 includes an inorganic insulating material such as silicon oxide, silicon nitride, or silicon oxynitride.

In an embodiment, the color filter layer 230 is disposed on the second protective layer 242. The color filter layer 230 includes a first color filter 231, a second color filter 232, and a third color filter 233. The first color filter 231 is disposed on the first color conversion pattern 251, the second color filter 232 is disposed on the second color conversion pattern 252, and the third color filter 233 is disposed on the light transmission pattern 253.

In an embodiment, the color filter layer 230 transmits light incident to the color filter layer 230 in a predetermined wavelength band and, and block light incident to the color filter layer 230 in other wavelength bands. The first color filter 231 transmits the first light L1 and blocks, for example, the second light L2 and the third light l3. The second color filter 232 transmits the second light L2 and blocks, for example, the first light L1 and the third light L3. The third color filter 233 transmits the third light L3 and blocks, for example, the first light L1 and the second light L2. In an embodiment, the first color filter 231, the second color filter 232, and the third color filter 233 are a red color filter, a green color filter, and a blue color filter, respectively.

In an embodiment, the light blocking layer 220 is disposed on the second protective layer 242. The light blocking layer 220 is disposed in the non-pixel area NPA. In an embodiment, the light blocking layer 220 is disposed between the first color filter 231, the second color filter 232, and the third color filter 233. In an embodiment, the light blocking layers 220 are formed in notches formed in the color filters where the different color filters come in contact with each other, and are spaced apart from the second protective layer 242 by the color filters, which extend between the light blocking layers 220 and the second protective layer 242. In an embodiment, the upper surfaces of the light blocking layers 220 are coplanar with upper surfaces of the color filters. The light blocking layer 220 blocks light incident to the light blocking layer 220. Accordingly, the light blocking layer 220 can prevent color mixing between the first pixel area PA1, the second pixel area PA2, and the third pixel area PA3. In an embodiment, the light blocking layer 220 includes the same material as the third color filter 233.

In an embodiment, the low reflection layer 400 is disposed on the color filter layer 230 and the light blocking layer 220. The low reflection layer 400 reduces reflectance of external light incident to the color filter layer 230. The low reflection layer 400 include a first low reflection pattern 410, a second low reflection pattern 420, and a third low reflection pattern 430. The first low reflection pattern 410 is disposed on the first color filter 231, the second low reflection pattern 420 is disposed on the second color filter 232, and the third low reflection pattern 430 is disposed on the third color filter 233 and the light blocking layers 220.

In an embodiment, the first low reflection pattern 410 includes a plurality of first inorganic layers. The first inorganic layers are laminated on the first color filter 231. Refractive indices of adjacent first inorganic layers of the first inorganic layers differ from each other. The first low reflection pattern 410 reduces reflectance of external light incident to the first color filter 231.

In an embodiment, the second low reflection pattern 420 includes a plurality of second inorganic layers. The second inorganic layers are laminated on the second color filter 232. Refractive indices of adjacent second inorganic layers of the second inorganic layers differ from each other. The second low reflection pattern 420 reduces reflectance of external light incident to the second color filter 232.

In an embodiment, the third first low reflection pattern 430 includes a plurality of third inorganic layers. The third inorganic layers are laminated on the third color filter 233 and the light blocking layers 220. Refractive indices of adjacent third inorganic layers of the third inorganic layers differ from each other. The third low reflection pattern 430 reduces reflectance of external light incident to the third color filter 233.

In an embodiment, each of the first low reflection pattern 410, the second low reflection pattern 420, and the third low reflection pattern 430 includes at least two different types of inorganic layers. In an embodiment, each of the first low reflection pattern 410, the second low reflection pattern 420, and the third low reflection pattern 430 includes at least two of a silicon nitride layer, a silicon oxide layer, or a silicon oxynitride layer.

In an embodiment, the first color filter 231, the second color filter 232, and the third color filter 233 include materials that differ each other. Accordingly, the first color filter 231, the second color filter 232, and the third color filter 233 have refractive indices for external light that differ from each other. In the first low reflection pattern 410, the second low reflection pattern 420, and the third low reflection pattern 430, at least one of the number of inorganic layers, the type of inorganic layers, and the lamination sequence of the inorganic layers differs from each other to reduce the reflectance for each of the first color filter 231, the second color filter 232, and the third color filter 233.

In embodiments, the number of layers of at least two of the first inorganic layers, the second inorganic layers, and the third inorganic layers differ from each other. In other words, a number of the first inorganic layers differs from a number of the second inorganic layers, or the number of the first inorganic layers differs from a number of the third inorganic layers, or the number of the first inorganic layers differs from both. In an embodiment, the number of the first inorganic layers, the number of the second inorganic layers, and the number of the third inorganic layers differ from each other. In an embodiment, two of the number of first inorganic layers, the number of second inorganic layers, and the number of third inorganic layers differ from each other. For example, the number of first inorganic layers and the number of second inorganic layers differ from each other, and the number of first inorganic layers is the same as the number of third inorganic layers. In the first low reflection pattern 410 and the third low reflection pattern 430, at least one of the types of inorganic layers and a lamination sequence of the inorganic layers may differ from each other. In an embodiment, each of the first low reflection pattern, the second low reflection pattern, and the third low reflection pattern includes at least two of a silicon nitride layer, a silicon oxide layer, and a silicon oxynitride layer.

In embodiments, the number of first inorganic layers, the number of second inorganic layers, and the number of third inorganic layers are same as each other, and at least two of the first inorganic layers, the second inorganic layers, and the third inorganic layers are different types from each other. In an embodiment, the types of first inorganic layers, the types of second inorganic layers, and the types of third inorganic layers differ from each other. For example, the first low reflection pattern 410 includes a silicon nitride layer and a silicon oxynitride layer, the second low reflection pattern 420 includes a silicon oxide layer and a silicon oxynitride layer, and the third low reflection pattern 430 includes a silicon nitride layer and a silicon oxide layer. In an embodiment, two of the types of first inorganic layers, the types of second inorganic layers, and the types of third inorganic layers differ from each other. For example, the types of first inorganic layers and the types of second inorganic layers differ from each other, and the types of first inorganic layers and the types of third inorganic layers are the same as each other. The first low reflection pattern 410 and the third low reflection pattern 430 have different lamination sequences of inorganic layers.

In embodiments, the number of first inorganic layers, the number of second inorganic layers, and the number of third inorganic layers are the same as each other, the types of first inorganic layers, the types of second inorganic layers, and the types of third inorganic layers are the same as each other, and the lamination sequence of the first inorganic layers, the lamination sequence of the second inorganic layers, and the lamination sequence of the third inorganic layers differ from each other. For example, when each of the first low reflection pattern 410, the second low reflection pattern 420, and the third low reflection pattern 430 includes three inorganic layers of a silicon nitride layer, a silicon oxide layer, and a silicon oxynitride layer, the first inorganic layers have a lamination sequence of a silicon oxide layer, a silicon nitride layer, and a silicon oxynitride layer, the second inorganic layers have a lamination sequence of a silicon nitride layer, a silicon oxynitride layer, and a silicon oxide layer, and the third inorganic layers have a lamination sequence of a silicon oxynitride layer, a silicon nitride layer, and a silicon oxide layer.

Figure 3:
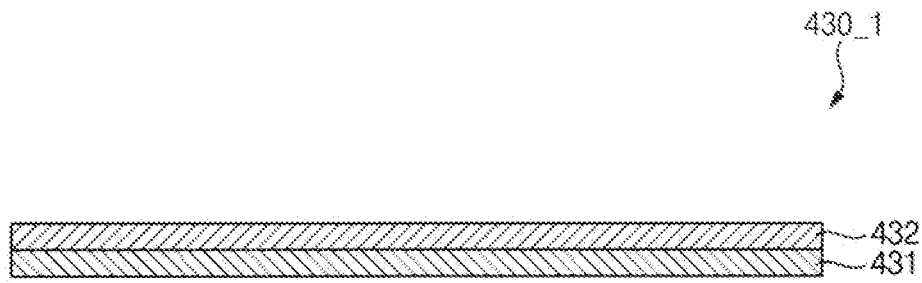
FIG. 3 is a sectional view of an example of a third low reflection pattern of FIG. 2.

FIG. 3 is a sectional view of an example of the third low reflection pattern 430 of FIG. 2.

Referring to FIG. 3, in an embodiment, the number of third inorganic layers of the third low reflection pattern 430_1 is two. The third low reflection pattern 430_1 includes a first-third inorganic layer 431 and a second-third inorganic layer 432 disposed on the first-third inorganic layer 431. In an embodiment, the first-third inorganic layer 431 is a silicon nitride layer, and the second-third inorganic layer 432 is a silicon oxide layer.

Figure 4:
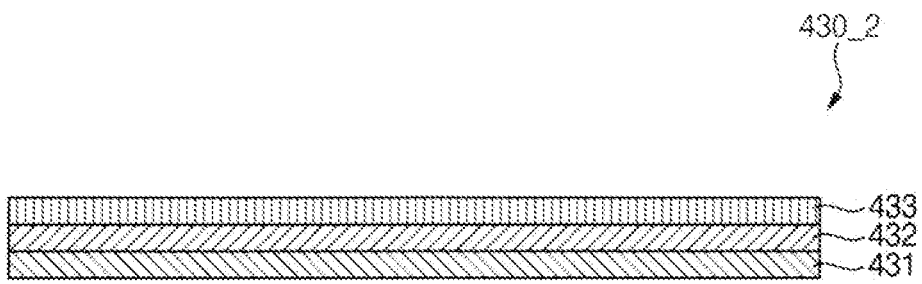
FIG. 4 is a sectional view of an example of a third low reflection pattern of FIG. 2.

FIG. 4 is a sectional view of an example of the third low reflection pattern 430 of FIG. 2.

Referring to FIG. 4, in an embodiment, the number of third inorganic layers of the third low reflection pattern 430_2 is three. The third low reflection pattern 430_2 includes a first-third inorganic layer 431, a second-third inorganic layer 432 disposed on the first-third inorganic layer 431, and a third-third inorganic layer 433 disposed on the second-third inorganic layer 432. In an embodiment, the first-third inorganic layer 431 is a silicon oxide layer, the second-third inorganic layer 432 is a silicon nitride layer, and the third-third inorganic layer 433 is a silicon oxide layer. In an embodiment, the first-third inorganic layer 431 is a silicon oxide layer, the second-third inorganic layer 432 is a silicon nitride layer, and the third-third inorganic layer 433 is a silicon oxynitride layer. In an embodiment, the first-third inorganic layer 431 is a silicon oxynitride layer, the second-third inorganic layer 432 is a silicon nitride layer, and the third-third inorganic layer 433 is a silicon oxide layer.

Figure 5:
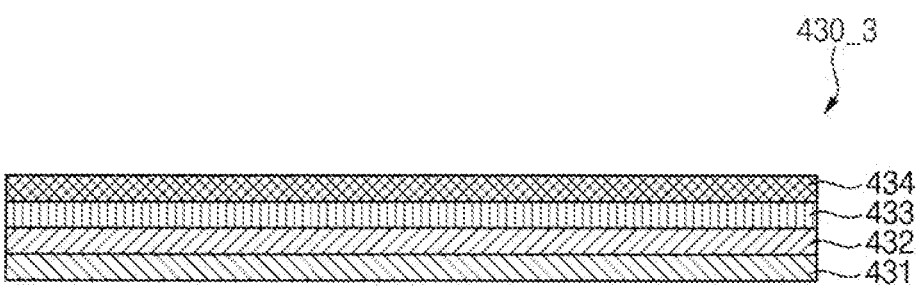
FIG. 5 is a sectional view of an example of a third low reflection pattern of FIG. 2.

FIG. 5 is a sectional view showing an example of the third low reflection pattern 430 of FIG. 2.

Referring to FIG. 5, in an embodiment, the number of third inorganic layers of the third low reflection pattern 430_3 is four. The third low reflection pattern 430_3 includes a first-third inorganic layer 431, a second-third inorganic layer 432 disposed on the first-third inorganic layer 431, a third-third inorganic layer 433 disposed on the second-third inorganic layer 432, and a fourth-third inorganic layer 434 disposed on the third-third inorganic layer 433. In an embodiment, the first-third inorganic layer 431 is a silicon oxide layer, the second-third inorganic layer 432 is a silicon oxynitride layer, the third-third inorganic layer 433 is a silicon nitride layer, and the fourth-third inorganic layer 434 is a silicon oxide layer. In an embodiment, the first-third inorganic layer 431 is a silicon oxynitride layer, the second-third inorganic layer 432 is a silicon oxide layer, the third-third inorganic layer 433 is a silicon nitride layer, and the fourth-third inorganic layer 434 is a silicon oxide layer.

Hereinafter, effects of embodiments of the present disclosure will be described through comparative examples and embodiments of the present disclosure.

COMPARATIVE EXAMPLE

A low reflection pattern is not disposed on a blue color filter, and the blue color filter has a thickness of about 2.4 μm.

Example 1

A low reflection pattern that includes a silicon nitride layer with a thickness of about 0.108 μm, and a silicon oxide layer with a thickness of about 0.076 μm that are sequentially laminated is disposed on a blue color filter with a thickness of about 2.4 μm.

Example 2

A low reflection pattern that includes a silicon oxide layer with thickness of about 0.152 μm, a silicon nitride layer with a thickness of about 0.1 μm, and a silicon oxide layer with thickness of about 0.076 μm that are sequentially laminated is disposed on a blue color filter with a thickness of about 2.4 μm.

Example 3

A low reflection pattern that includes a silicon oxide layer with a thickness of about 0.348 μm, a silicon nitride layer with a thickness of about 0.074 μm, and a silicon oxynitride layer with a thickness of about 0.084 μm that are sequentially laminated is disposed on a blue color filter having a thickness of about 2.4 μm.

Example 4

A low reflection pattern that includes a silicon oxynitride layer with a thickness of about 0.106 μm, a silicon nitride layer with a thickness of about 0.096 μm, and a silicon oxide layer with a thickness of about 0.08 μm that are sequentially laminated is disposed on a blue color filter with a thickness of about 2.4 μm.

Example 5

A low reflection pattern that includes a silicon oxide layer with a thickness of about 0.108 μm, a silicon oxynitride layer with a thickness of about 0.25 μm, a silicon nitride layer with a thickness of about 0.054 μm, and a silicon oxide layer with a thickness of about 0.1 μm that are sequentially laminated is disposed on a blue color filter with a thickness of about 2.4 μm.

Example 6

A low reflection pattern that includes a silicon oxynitride layer with a thickness of about 0.12 μm, a silicon oxide layer with a thickness of about 0.192 μm, a silicon nitride layer with a thickness of about 0.042 μm, and a silicon oxide layer with a thickness of about 0.108 μm that are sequentially laminated is disposed on a blue color filter with a thickness of about 2.4 μm.

Table 1 shows the lowest reflectance derived using a reflection simulation tool with respect to the laminated structures according to the comparative example and the examples 1 to 6.

TABLE 1

| Laminated structure | Lowest reflectance (%) |
|---|---|
| Comparative Example | 4.88 |
| Example 1 | 0.70 |
| Example 2 | 0.43 |
| Example 3 | 0.60 |
| Example 4 | 0.38 |
| Example 5 | 0.32 |
| Example 6 | 0.38 |

Referring to Table 1, it can be seen that the laminated structures of Examples 1 to 6 that include a low reflection pattern have a minimum reflectance that is smaller than the laminated structure of the comparative example that lacks the low reflection pattern. In particular, the laminated structures of Example 2 and Examples 4 to 6 have a lowest reflectivity of about 0.4% that is similar to a case in which an anti-reflective (AR) film adheres onto a conventional color filter.

Referring back to FIG. 2, in an embodiment, a thickness of each of the first inorganic layers, a thickness of each of the second inorganic layers, and a thickness of each of the third inorganic layers is about 3000 Å or less. Accordingly, a thickness of the low reflection layer 400 can be prevented from increasing.

In an embodiment, the third low reflection pattern 430 overlaps the light blocking layer 220. In other words, the third low reflection pattern 430 is disposed on the light blocking layer 220 as well as the third color filter 233. As described above, the light blocking layer 220 includes the same material as the third color filter 233, and the light blocking layer 220 and the third color filter 233 have the same refractive index. Thus, the third low reflection pattern 430 is also disposed on the light blocking layer 220.

Figure 6:
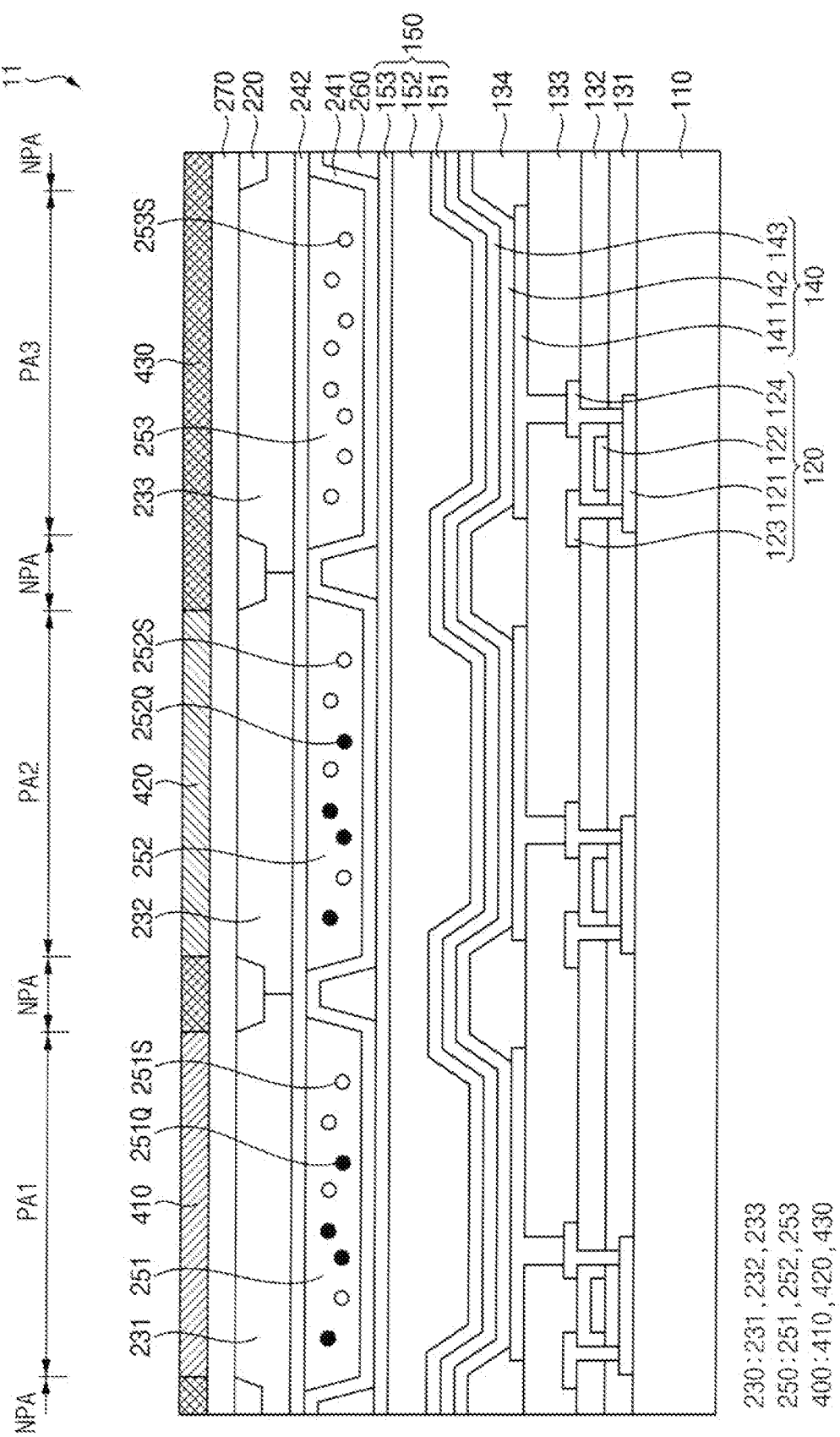
FIG. 6 is a sectional view of a display device according to an embodiment of the present disclosure.

FIG. 6 is a sectional view of a display device according to an embodiment of the present disclosure.

A display device 11 described with reference to FIG. 6 is substantially the same as or similar to the display device 10 described with reference to FIGS. 1 and 2, except for further including an overcoat layer 270. Accordingly, a description of redundant configurations will be omitted.

In an embodiment, the display device 11 further includes an overcoat layer 270 disposed between the color filter layer 230 and the low reflection layer 400. The overcoat layer 270 includes an organic material such as a cardo-based resin, a polyimide-based resin, an acryl-based resin, a siloxane-based resin, or a silsesquioxane-based resin. The overcoat layer 270 planarizes an upper part of the color filter layer 230. Accordingly, the overcoat layer 270 provides a flat surface on the low reflection layer 400.

Figure 7:
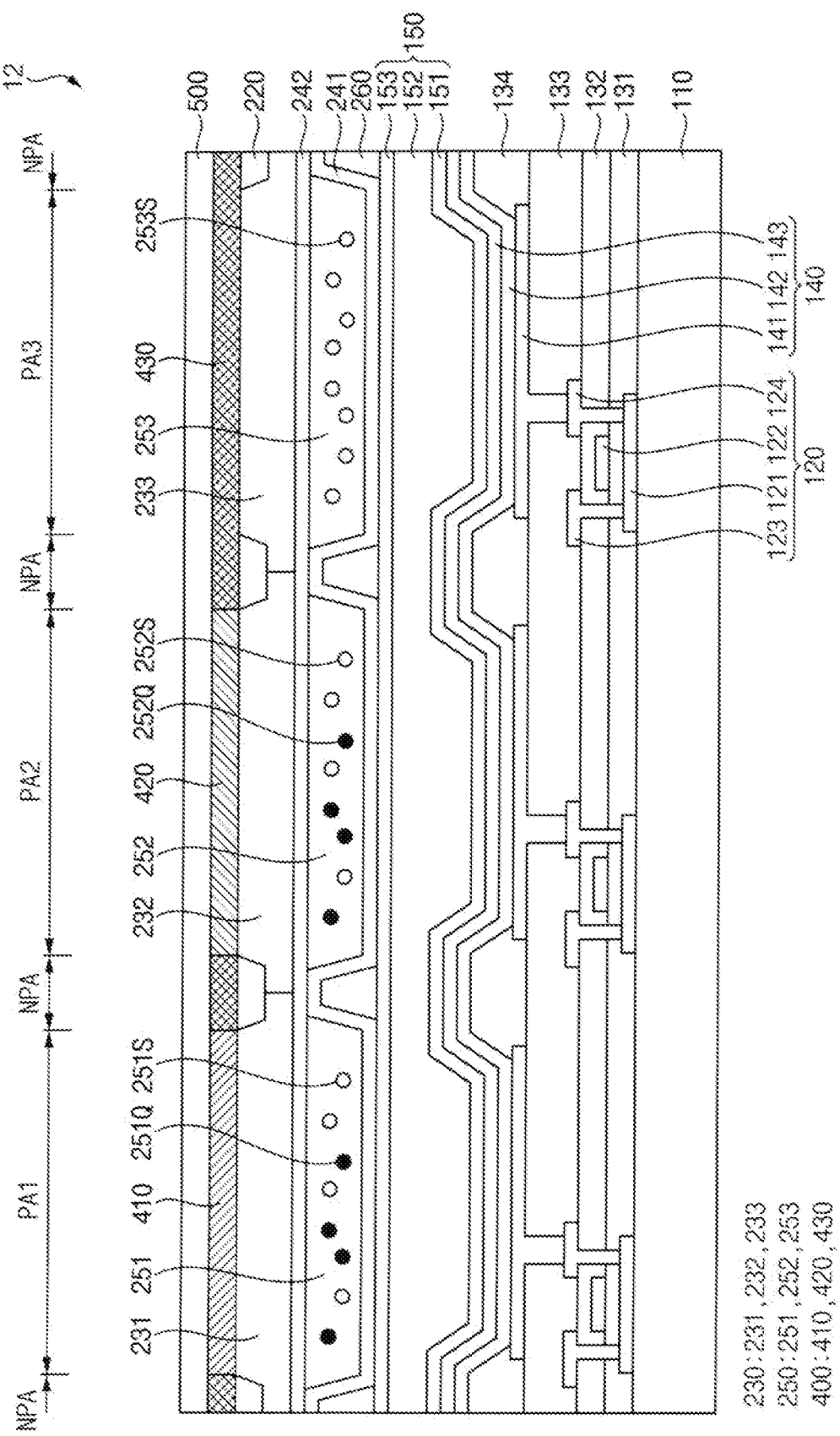
FIG. 7 is a sectional view of a display device according to an embodiment of the present disclosure.

FIG. 7 is a sectional view of a display device according to an embodiment of the present disclosure.

A display device 12 described with reference to FIG. 7 is substantially the same as or similar to the display device 10 described with reference to FIGS. 1 and 2, except for further including a hard coating layer 500. Accordingly, a description of redundant configurations will be omitted.

In an embodiment, the display device 12 further includes a hard coating layer 500 disposed on the low reflection layer 400. The hard coating layer 500 includes at least one of a urethane-based resin, an epoxy-based resin, an acryl-based resin, or an acrylate-based resin. The hard coating layer 500 protects the low reflection layer 400 from external impacts.

Figure 8:
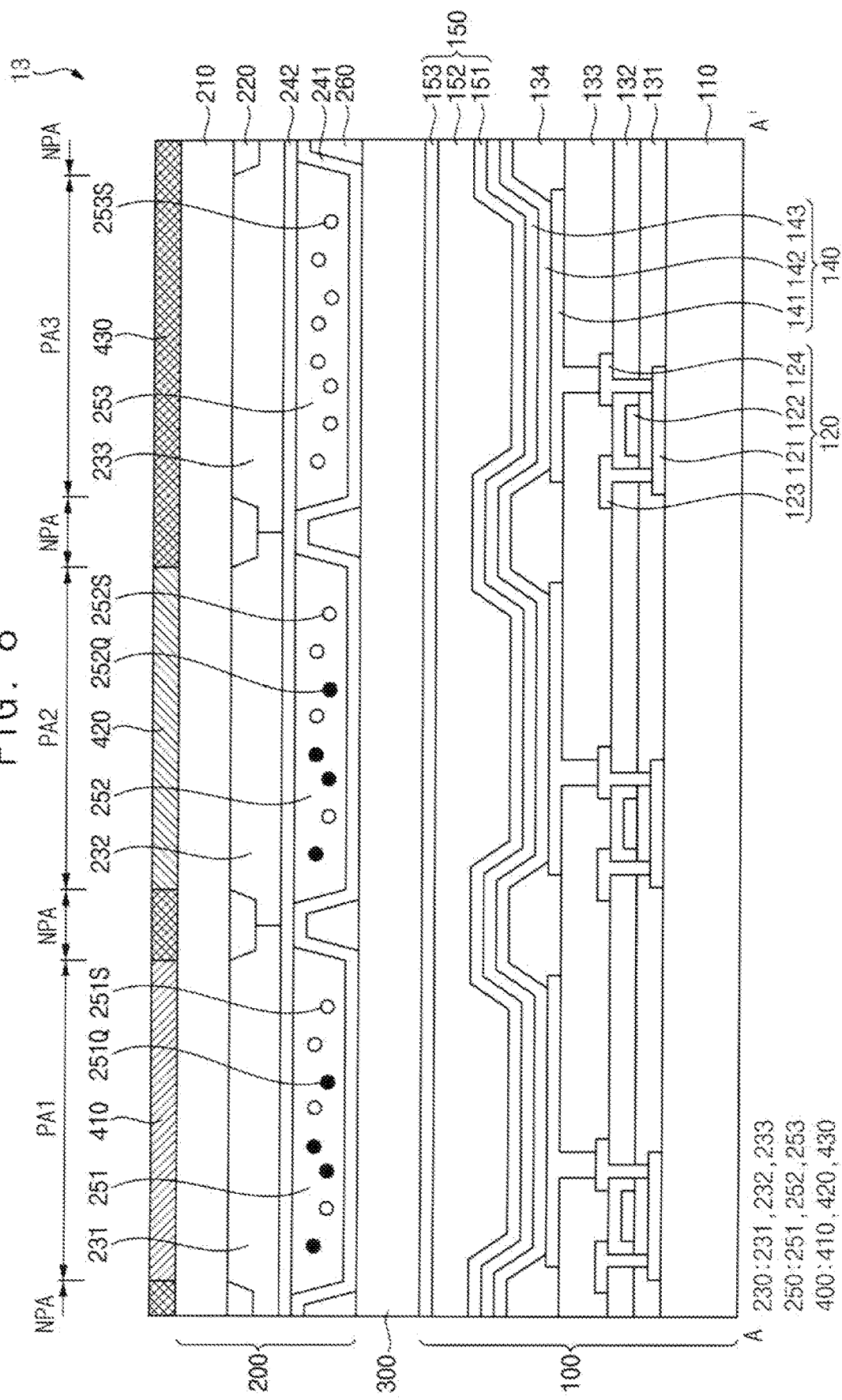
FIG. 8 is a sectional view of a display device according to an embodiment of the present disclosure.

FIG. 8 is a sectional view of a display device according to an embodiment of the present disclosure.

A display device 13 described with reference to FIG. 8 is substantially the same as or similar to the display device 10 described with reference to FIGS. 1 and 2, except for further including a second substrate 210 and a filling layer 300. Accordingly, a description of redundant configurations will be omitted.

In an embodiment, the display device 13 further includes a second substrate 210 disposed between the color filter layer 230 and the low reflection layer 400, and a filling layer 300 disposed between the light emitting device 140 and the color conversion layer 250. The first substrate 110, the transistor 120, the light emitting device 140, and the thin film encapsulation layer 150 form a display panel 100, and the second substrate 210, the light blocking layer 220, the color filter layer 230, the first protective layer 241, the second protective layer 242, the color conversion layer 250, and the bank layer 260 form the color conversion panel 200.

In an embodiment, the second substrate 210 is a transparent insulating substrate. The second substrate 210 may include one or more of glass or quartz, etc. In an embodiment, the second substrate 210 includes an organic insulating material such as polyimide, polycarbonate, polyethylene terephthalate, or polyacrylate.

The filling layer 300 is be disposed between the display panel 100 and the color conversion panel 200. The filling layer 300 is disposed between the thin film encapsulation layer 150 of the display panel 100 and the first protective layer 241 and the bank layer 260 of the color conversion panel 200. The filling layer 300 is a buffer so that the display panel 100 and the color conversion panel 200 are stably adhered to each other. The filling layer 300 transmits light emitted from the display panel 100. The filling layer 300 includes an organic material such as a silicone-based organic material, an epoxy-based organic material, or an epoxy-acryl-based organic material. For example, the filling layer 300 includes silicon rubber.

a display device according to embodiments can be incorporated into a display device included in a computer, a notebook, a mobile phone, a smartphone, a smart pad, a PMP, a PDA, or an MP3 player, etc.

Although display devices according to embodiments have been described with reference to the drawings, illustrated embodiments are examples, and may be modified and changed by a person having ordinary knowledge in the relevant technical field without departing from the technical spirit described in the following claims.

What is claimed is:

1. A display device, comprising:
a first pixel area, a second pixel area, a third pixel area, and a non-pixel area between the first to third pixel areas;
a first substrate;
a light emitting device disposed on the first substrate in each of the first to third pixel areas;
a color conversion layer that includes a first color conversion pattern, a second color conversion pattern, and a light transmission pattern disposed on the light emitting device in the first pixel area, the second pixel area, and the third pixel area, respectively;
a color filter layer that includes a first color filter, a second color filter, and a third color filter disposed on the first color conversion pattern, the second color conversion pattern, and the light transmission pattern, respectively; and
a low reflection layer that includes a first low reflection pattern disposed on the first color filter and that includes a plurality of first inorganic layers, a second low reflection pattern disposed on the second color filter and that includes a plurality of second inorganic layers, and a third low reflection pattern disposed on the third color filter and between each pair of adjacent first and second low reflection patterns and that includes a plurality of third inorganic layers, wherein
a number of at least two of the first inorganic layers, second inorganic layers, and third inorganic layers differ from each other.

2. The display device of claim 1, wherein each of the first low reflection pattern, the second low reflection pattern, and the third low reflection pattern includes at least two of a silicon nitride layer, a silicon oxide layer, and a silicon oxynitride layer.

3. The display device of claim 1, wherein the third color filter includes a blue color filter.

4. The display device of claim 1, wherein a number of third inorganic layers is two.

5. The display device of claim 4, wherein the third low reflection pattern includes a silicon nitride layer and a silicon oxide layer disposed on the silicon nitride layer.

6. The display device of claim 1, wherein a number of third inorganic layers is three.

7. The display device of claim 6, wherein the third low reflection pattern includes a first silicon oxide layer, a silicon nitride layer disposed on the first silicon oxide layer, and a second silicon oxide layer disposed on the silicon nitride layer.

8. The display device of claim 6, wherein the third low reflection pattern includes a silicon oxide layer, a silicon nitride layer disposed on the silicon oxide layer, and a silicon oxynitride layer disposed on the silicon nitride layer.

9. The display device of claim 6, wherein the third low reflection pattern includes a silicon oxynitride layer, a silicon nitride layer disposed on the silicon oxynitride layer, and a silicon oxide layer disposed on the silicon nitride layer.

10. The display device of claim 1, wherein a number of third inorganic layers is four.

11. The display device of claim 10, wherein the third low reflection pattern includes a first silicon oxide layer, a silicon oxynitride layer disposed on the first silicon oxide layer, a silicon nitride layer disposed on the silicon oxynitride layer, and a second silicon oxide layer disposed on the silicon nitride layer.

12. The display device of claim 10, wherein the third low reflection pattern includes a silicon oxynitride layer, a first silicon oxide layer disposed on the silicon oxynitride layer, a silicon nitride layer disposed on the first silicon oxide layer, and a second silicon oxide layer disposed on the silicon nitride layer.

13. The display device of claim 1, further comprising:
a light blocking layer disposed in the non-pixel area between the color conversion layer and the low reflection layer, and that includes a same material as that of the third color filter.

14. The display device of claim 13, wherein the third low reflection pattern overlaps the light blocking layer.

15. The display device of claim 1, further comprising:
an overcoat layer disposed between the color filter layer and the low reflection layer.

16. The display device of claim 1, further comprising:
a hard coating layer disposed on the low reflection layer.

17. The display device of claim 1, further comprising:
a second substrate disposed between the color filter layer and the low reflection layer; and
a filling layer disposed between the light emitting device and the color conversion layer.

18. The display device of claim 1, wherein a thickness of each of the first inorganic layers, the second inorganic layers, and the third inorganic layers is about 3000 Å or less.

* * * * *